United States Patent
Motoyui

(10) Patent No.: US 7,626,430 B2
(45) Date of Patent: Dec. 1, 2009

(54) TRIANGULAR-WAVE GENERATING APPARATUS INCORPORATING CAPACITOR

(75) Inventor: Toshiaki Motoyui, Shiga (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 15 days.

(21) Appl. No.: 11/710,608

(22) Filed: Feb. 26, 2007

(65) Prior Publication Data
US 2007/0273452 A1 Nov. 29, 2007

(30) Foreign Application Priority Data
Feb. 27, 2006 (JP) .............................. 2006-050500

(51) Int. Cl.
*H03K 4/06* (2006.01)
(52) U.S. Cl. .................. 327/131; 327/132; 327/135; 327/137
(58) Field of Classification Search ................. 327/131, 327/132, 135, 137
See application file for complete search history.

(56) References Cited

U.S. PATENT DOCUMENTS 3,893,036 A * 7/1975 Cavoretto et al. ........... 327/126
6,791,405 B2 * 9/2004 Tsuji et al. ..................... 330/10
6,956,431 B2 * 10/2005 Maejima ........................ 330/10
7,362,150 B2 * 4/2008 Fukumoto .................... 327/131

FOREIGN PATENT DOCUMENTS

JP 2002-217687 8/2002

* cited by examiner

*Primary Examiner*—Kenneth B. Wells
(74) *Attorney, Agent, or Firm*—McGinn IP Law Group, PLLC

(57) ABSTRACT

In a triangular-wave generating apparatus including an output terminal adapted to output an output voltage, an incorporated capacitor connected to the output terminal, a first variable current source adapted to charge the incorporated capacitor and a second variable current source adapted to discharge the incorporated capacitor, a charging/discharging current setting circuit sets a charging current in the first variable current source and sets a discharging current in the second variable current source. A level determining circuit determines whether or not the output voltage reaches one of predetermined voltages, to generate timing signals. A reference clock signal generating circuit generates a reference clock signal for defining a frequency of the output voltage. A charging/discharging current adjusting circuit adjusts the charging current and the discharging current in accordance with the timing signals and the reference clock signal.

20 Claims, 9 Drawing Sheets

TRIANGULAR-WAVE GENERATING APPARATUS INCORPORATING CAPACITOR

BACKGROUND OF THE INVENTION

1. Field of the Invention

The present invention relates to an oscillation apparatus, and more particularly, to a triangular-wave generating apparatus.

2. Description of the Related Art

A prior art triangular-wave generating apparatus is connected to an external capacitor for generating an output voltage (see: JP-2002-217687A). This prior art triangular-wave generating apparatus is constructed by a first constant current source for charging the external capacitor, a charging switch, a discharging switch, a second constant current source for discharging the external capacitor, a charging/discharging current setting circuit, a level determining circuit and a driver formed by an RS flip-flop.

The charging/discharging current setting circuit sets a charging current in the first constant current source and sets a discharging current in the second constant current source.

The level determining circuit is constructed by a first comparator for determining whether or not the output voltage reaches a high level to generate a first comparison signal, and a second comparator for determining whether or not the output voltage reaches a low level to generate a second comparison signal. The first and second comparison signals are supplied to the driver (RS flip-flop). That is, when the output voltage reaches the high level, the RS flip-flop is set to turn ON the discharging switch and turn OFF the charging switch, thus entering a discharging mode. On the other hand, when the output voltage reaches the low level, the RS flip-flop is reset to turn ON the charging switch and turn OFF the discharging switch, thus entering a charging mode.

This prior art triangular-wave generating apparatus will be explained later in detail.

SUMMARY OF THE INVENTION

In the above-described prior art triangular-wave generating apparatus, however, since the frequency of the output voltage is adjusted only by replacing the external capacitor with another, it is impossible to incorporate the external capacitor into the triangular-wave generating apparatus. Particularly, when the frequency of the output voltage is much lower, so that the capacitance of the external capacitor is much larger, it is actually impossible to incorporate such a large external capacitor into the triangular-wave generating apparatus. In this case, if the output voltage is used only within an integrated circuit chip including the triangular-wave generating apparatus, a special external terminal is required for the external capacitor, which would increase the size of the integrated circuit chip.

On the other hand, in order to increase the frequency of the output voltage, the capacitance of the external capacitor needs to be smaller and the delay time of each of the first and second comparators needs to be smaller. However, since the transistors of the charging/discharging current setting circuit have large parasitic capacitances, it is difficult to decrease the capacitance of the external capacitor. Also, the decrease of the delay time of each of the first and second comparators may be realized by increasing bias currents flowing therethrough using bias control circuits. In this case, however, the power consumption would be increased.

Further, the frequency of the output voltage fluctuates due to the fluctuation of the charging current of the first constant current source and the discharging current of the second constant current source and the fluctuation of the capacitance of the external capacitor.

Additionally, since the capacitance of the external capacitor is generally large, the charging current and the discharging current would be so large that the power consumption would be increased.

According to the present invention, in a triangular-wave generating apparatus including an output terminal adapted to output an output voltage, an incorporated capacitor connected to the output terminal, a first variable current source adapted to charge the incorporated capacitor and a second variable current source adapted to discharge the incorporated capacitor, a charging/discharging current setting circuit sets a charging current in the first variable current source and sets a discharging current in the second variable current source. A level determining circuit determines whether or not the output voltage is at one of predetermined voltages, to generate timing signals. A reference clock signal generating circuit generates a reference clock signal for defining a frequency of the output voltage. A charging/discharging current adjusting circuit adjusts the charging current and the discharging current in accordance with the timing signals and the reference clock signal.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art triangular-wave generating apparatus will be explained with reference to FIGS. 1 and 2 (see: FIGS. 11, 16, 17 and 18 of JP-2002-217687A).

Figure 1:
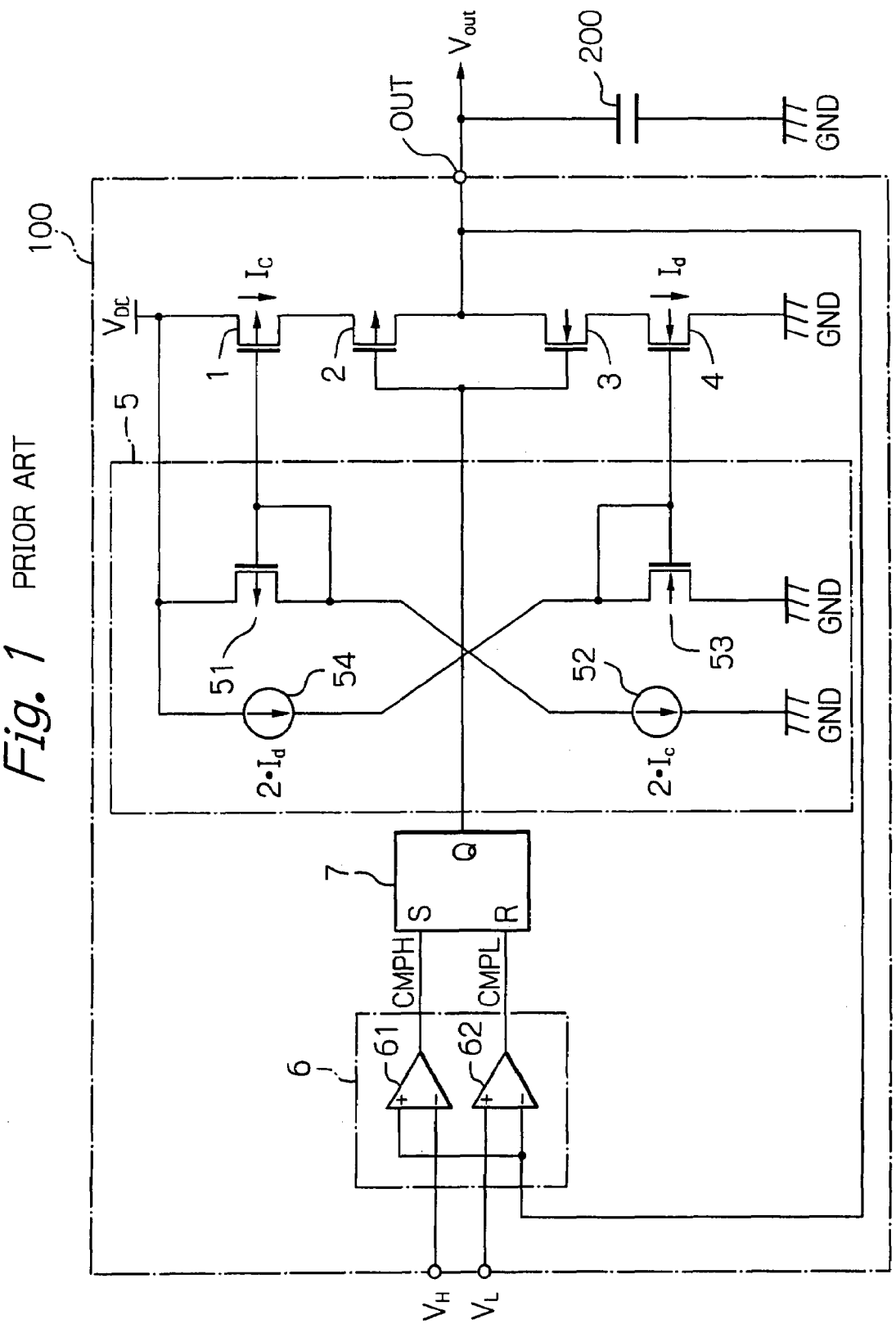
FIG. 1 is a circuit diagram illustrating a prior art triangular-wave generating apparatus.

In FIG. 1, a triangular-wave generating apparatus 100 includes an output terminal OUT for generating an output voltage $V_{out}$ which is connected to an external capacitor 200.

The triangular-wave generating apparatus 100 is constructed by a constant current source 1 formed by a p-channel MOS transistor for charging the external capacitor 200 by a charging current $I_c$, a charging switch 2 formed by a p-channel MOS transistor, a discharging switch 3 formed by an n-channel MOS transistor, and a constant current source 4 formed by an n-channel MOS transistor for discharging the external capacitor 200 by a discharging current $I_d$.

The constant current source 1, the charging switch 2, the discharging switch 3 and the constant current source 4 are connected in series between a power supply terminal ($V_{DD}$) and a ground terminal (GND).

A charging/discharging current setting circuit 5 sets the charging current $I_c$ in the constant current source 1 and sets the discharging current $I_d$ in the constant current source 4. That is, the charging/discharging current setting circuit 5 is constructed by a p-channel MOS transistor 51 and a constant current source 52 connected in series. In this case, the p-channel MOS transistor 51 forms a current mirror circuit with the constant current source 1, so that a current of constant current source 52 is $2 \cdot I_c$ under the condition that the size of the p-channel MOS transistor 51 is the same as that of the constant current source 1. Similarly, the charging/discharging current setting circuit 5 is constructed by an n-channel MOS transistor 53 and a constant current source 54 connected in series. In this case, the n-channel MOS transistor 53 forms a current mirror circuit with the constant current source 4, so that a current of constant current source 54 is $2 \cdot I_d$ under the condition that the size of the n-channel MOS transistor 53 is the same as that of the constant current source 4.

A level determining circuit 6 is constructed by a comparator 61 for determining whether or not the output voltage $V_{out}$ reaches a high level $V_H$ to generate a comparison signal CMPH, and a comparator 62 for determining whether or not the output voltage $V_{out}$ reaches a low level $V_L$ to generate a comparison signal CMPL. The comparison signals CMPH and CMPL are supplied to a driver 7 formed by an RS flip-flop. That is, as illustrated in FIG. 2, when the output voltage $V_{out}$ reaches the high level $V_H$, the driver (RS flip-flop) 7 is set (Q=$V_{DD}$) to turn ON the discharging switch 3 and turn OFF the charging switch 2, thus entering a discharging mode. On the other hand, as illustrated in FIG. 2, when the output voltage $V_{out}$ reaches the low level $V_L$, the driver (RS flip-flop) 7 is reset (Q=GND) to turn ON the charging switch 2 and turn OFF the discharging switch 3, thus entering a charging mode.

Figure 2:
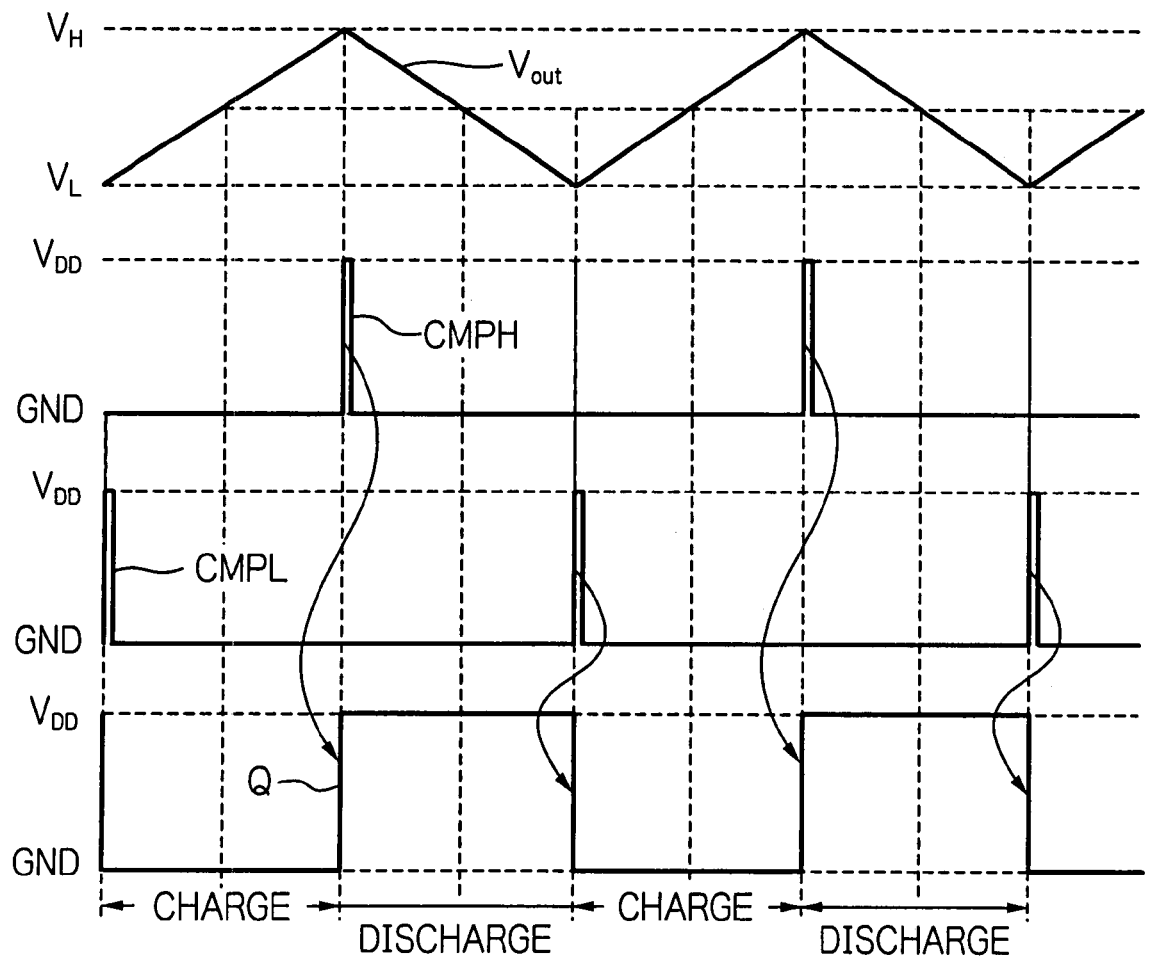
FIG. 2 is a timing diagram for explaining the operation of the triangular-wave generating apparatus of FIG. 1.

In FIG. 2, if the charging current $I_c$ is the same as the discharging current $I_d$, the output voltage $V_{out}$ is symmetrical with respect to the charging mode and the discharging mode.

In the triangular-wave generating apparatus 100 of FIG. 1, the frequency of the output voltage $V_{out}$ is determined by the charging current $I_c$, the discharging current $I_d$ and the capacitance of the external capacitor 200. Therefore, since the charging current $I_c$ and the discharging current $I_d$ are fixed, the frequency of the output voltage $V_{out}$ is adjusted only by replacing the external capacitor 200 with another. As a result, it is impossible to incorporate the external capacitor 200 into the triangular-wave generating apparatus 100. Particularly, when the frequency of the output voltage $V_{out}$ is much lower, i.e., about 100 kHz, each of the charging current $I_c$ and the discharging current $I_d$ is several µA and the capacitance of the external capacitor 200 is about several hundreds of pF. In this case, it is actually impossible to incorporate such a large external capacitor 200 into the triangular-wave generating apparatus 100. In this case, if the output voltage $V_{out}$ is used only within an integrated circuit chip including the triangular-wave generating apparatus 100, i.e, the output terminal OUT is an internal terminal, a special external terminal is required for the external capacitor 200, which would increase the size of the integrated circuit chip.

On the other hand, in order to increase the frequency of the output voltage $V_{out}$, the capacitance of the external capacitor 200 needs to be smaller and the delay time of each of the comparators 61 and 62 needs to be smaller. However, since the transistors of the charging/discharging current setting circuit 5 have large parasitic capacitances, it is difficult to decrease the capacitance of the external capacitor 200. Also, the decrease of the delay time of each of the comparators 61 and 62 may be realized by increasing bias currents flowing therethrough using bias control circuits (not shown) (see: FIGS. 1, 6, 7, 8 and 9 of JP-2002-217687-A). In this case, however, the power consumption would be increased.

Further, the frequency of the output voltage $V_{out}$ fluctuates due to the fluctuation of the charging current $I_c$ of the constant current source 1 and the discharging current $I_d$ of the constant current source 4 and the fluctuation of the capacitance of the external capacitor 200.

Additionally, since the capacitance of the external capacitor 200 is generally large, the charging current $I_c$ and the discharging current $I_d$ would be so large that the power consumption would be increased.

Figure 3:
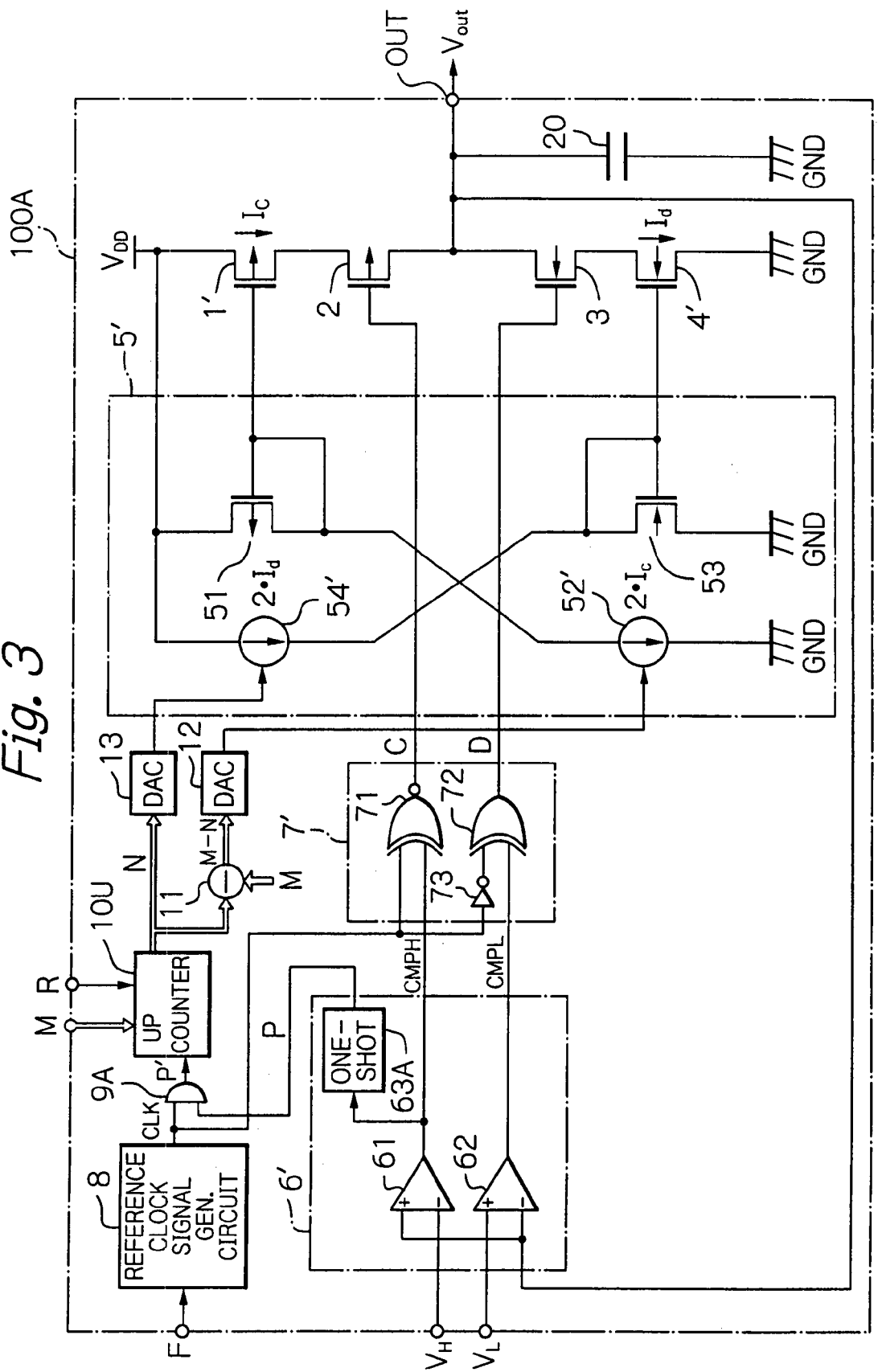
FIG. 3 is a circuit diagram illustrating a first embodiment of the triangular-wave generating apparatus according to the present invention.

In FIG. 3, which illustrates a first embodiment of the triangular-wave generating apparatus according to the present invention, the triangular-wave generating apparatus is generally denoted by reference numeral 100A, and a capacitor 20 is incorporated thereinto instead of the external capacitor 200 of FIG. 1. Therefore, a special external terminal for the external capacitor 200 is unnecessary, even if the output terminal OUT is an internal terminal.

In the triangular-wave generating apparatus 100A of FIG. 3, the constant current sources 1 and 4 of FIG. 1 are replaced by variable current sources 1' and 4', respectively. Also, the charging/discharging current setting circuit 5 of FIG. 1 is replaced by a charging/discharging current setting circuit 5' where the constant current sources 52 and 54 of FIG. 1 are replaced by variable current sources 52' and 54' which are formed by a p-channel MOS transistor and an n-channel MOS transistor, respectively. That is, as the currents $2 \cdot I_c$ and $2 \cdot I_d$ flowing through the variable current sources 52' and 54' change, the currents $I_c$ and $I_d$ flowing through the variable current sources 1' and 4' change.

Also, the level determining circuit 6 of FIG. 1 is replaced by a level determining circuit 6' where a one-shot multivibrator (monostable multivibrator) 63A is added to the level determining circuit 6 of FIG. 1. The one-shot multivibrator 63A generates a one-shot pulse signal P when the comparison signal CMPH of the comparator 61 is switched from low to high. Additionally, the driver (RS flip-flop) 7 of FIG. 1 is replaced by a driver 7'.

Further, the triangular-wave generating apparatus 100A includes a reference clock signal generating circuit 8, an AND circuit 9A, an up counter 10U, a subtracter 11 and digital-to-analog converters 12 and 13.

In the driver 7', an exclusive NOR circuit 71 receives a reference clock signal CLK from the reference clock signal generating circuit 8 and the comparison signal CMPH from the comparator 61, to thereby generate a charging signal C which is transmitted to the charging switch 2. Also, an exclusive OR circuit 72 receives the reference clock signal CLK via an inverter 73 from the reference clock signal generating circuit 8 and the comparison signal CMPL from the comparator 62, to thereby generate a discharging signal D which is transmitted to the discharging switch 3.

In the reference clock signal generating circuit 8, the frequency of the reference clock signal CLK is changed by receiving a signal F, so that the frequency of the output voltage $V_{out}$ is the same as that of the reference clock signal CLK. In this case, the reference clock signal CLK is a rectangular wave signal having a high level voltage for half period and a low level voltage for another half period.

The AND circuit 9A, the up counter 10U, the subtracter 11 and the digital-to-analog converters 12 and 13 form a charging/discharging current adjusting circuit for adjusting the charging current $I_c$ and the discharging current $I_d$, which is explained below in detail.

The AND circuit 9A passes the one-shot pulse signal P as a one-shot pulse signal P', only when the reference clock signal CLK is high ($V_{DD}$).

The up counter 10U is reset by a reset signal R and counts the one-shot pulse signal P'. In this case, the count value N is incremented by an amount of 1 least signicant bit (LSB) every time a one-shot pulse signal P' is received. The count value N of the up counter 10U is subject to digital-to-analog conversions by the digital-to-analog converters 12 and 13. In this case, every increase in the amount of the count value N of the up counter 10U corresponds to a minimum charge amount of the analog output signals of the digital-to-analog converters 12 and 13, thus increasing the accuracy of the triangular wave.

The count value N is supplied via the subtracter 11 to the digital-to-analog converter 12. That is, the subtracter 11 subtracts the count value N from its maximum value M corresponding to "11 . . . 1" and transmits a value M−N to the digital-to-analog converter 12. Therefore, as the count value N increases, the analog output value of the digital-to-analog converter 12 decreases so that the current $2 \cdot I_c$ flowing through the variable current source 52' is decreased, i.e., the charging current $I_c$ is decreased. On the other hand, the count value N is supplied directly to the digital-to-analog converter 13. Therefore, as the count value N increases, the analog output value of the digital-to-analog converter 12 increases so that the current $2 \cdot I_d$ flowing through the variable current source 54' is decreased, i.e., the discharging current $I_d$ is decreased.

When the reference clock signal CLK is switched from low to high, the charging signal C is switched from high to low, thus entering a charging mode.

On the other hand, when the reference clock signal CLK is switched from high to low, the charging signal C is switched from low to high, thus completing the charging mode. In this case, if the comparison signal CMPH rises before the falling of the reference clock signal CLK, the charging mode is completed at the rising timing of the comparison signal CMPH, and simultaneously, a one-shot pulse signal P is generated from the one-shot multivibrator 63A and passes through the AND circuit 9A as a one-shot pulse signal P', to thereby increase the count value N of the up counter 10U.

When the reference clock signal CLK is switched from high to low, the discharging signal D is switched from low to high, thus entering a discharging mode.

On the other hand, when the reference clock signal CLK is switched from low to high, the discharging signal D is switched from high to low, thus completing the discharging mode. In this case, if the comparison signal CMPL rises before the rising of the reference clock signal CLK, the discharging mode is completed at the rising timing of the comparison signal CMPL.

The charging speed of the capacitor 20 depends upon the charging current $I_c$ flowing through the variable current source 1', and the discharging speed of the capacitor 20 depends upon the discharging current $I_d$ flowing through the variable current source 4'. Also, the charging current $I_c$ flowing through the variable current source 1' depends upon the current flowing through the variable current source 52', and the discharging current $I_d$ flowing through the variable current source 4' depends upon the current flowing through the variable current source 54'. Therefore, since the currents flowing through the variable current sources 52' and 54' gradually decrease as the count value N of the up counter 10U increases, the charging current $I_c$ and the discharging current $I_d$ gradually decrease as the count value N of the up counter 10U increases.

Figure 4:
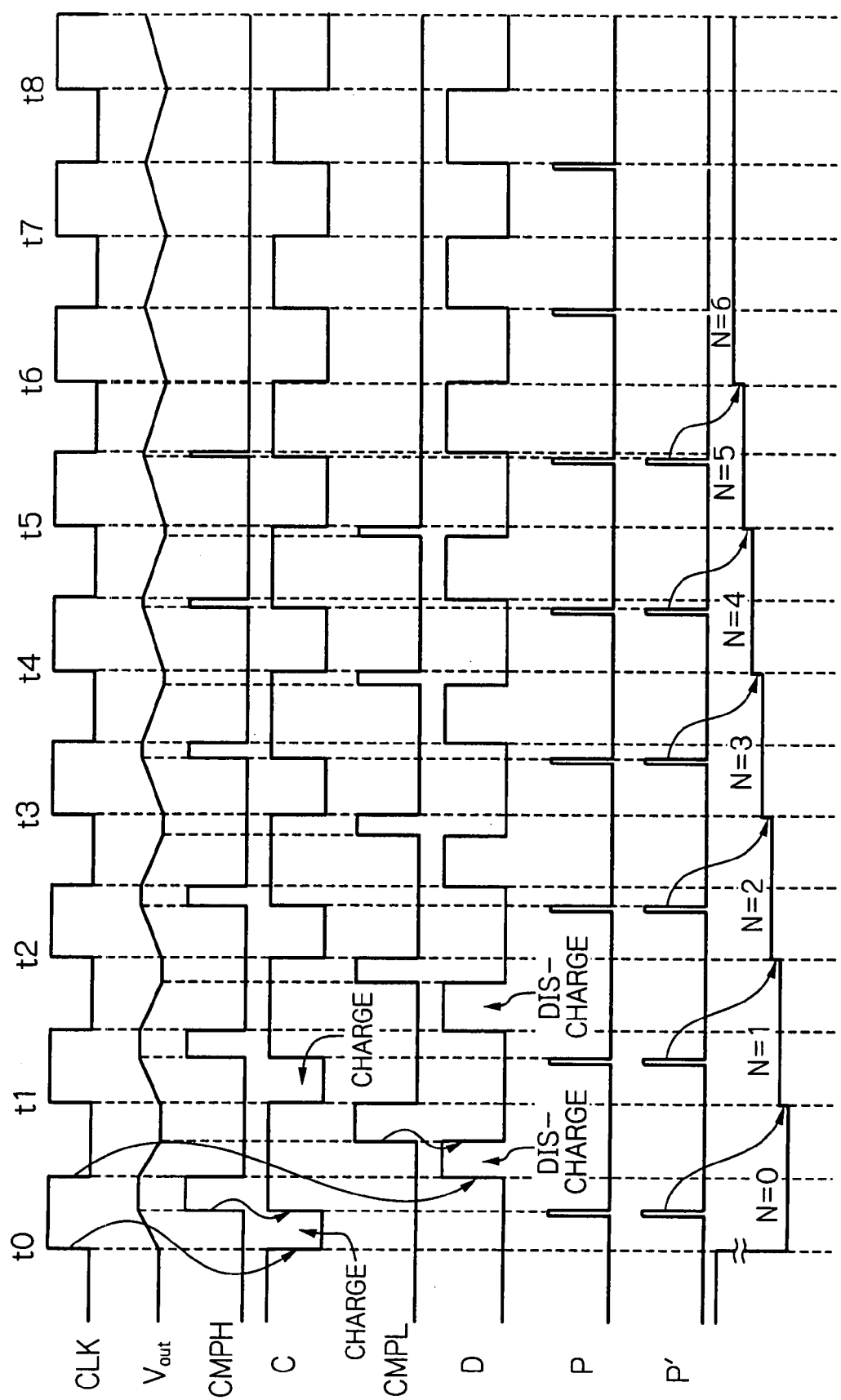
FIG. 4 is a timing diagram for explaining the operation of the triangular-wave generating apparatus of FIG. 3.

The operation of the triangular-wave generating apparatus 100A of FIG. 3 is explained next with reference to FIG. 4. In FIG. 4, the count value N of the up counter 10U is initially reset by the reset signal R so that N=0.

First, during a time period from time t0 to time t1, since N=0, the charging speed and the discharging speed are so rapid that the output voltage $V_{out}$ forms a trapezoidal shape. As a result, a one-shot pulse signal P is generated before the falling timing of the reference clock signal CLK, and passes through the AND circuit 9A as a one-shot pulse signal P'. Thus, the count value N of the up counter 10U is incremented by 1, so that N=1.

Next, during a time period from time t1 to time t2, since N=1, the charging speed and the discharging speed are slightly decreased; however, the output voltage $V_{out}$ still forms a trapezoidal shape. Thus, the count value N of the up counter 10U is incremented by 1, so that N=2.

During a time period from time t2 to time t3, during a time period from time t3 to time t4, during a time period from time t4 to time t5, and during a time period from time t5 to time t6, although the charging speed and the discharging speed are gradually decreased, the output voltage $V_{out}$ still forms a trapezoidal shape. Thus, the count value N of the up counter 10U reaches 5.

Finally, after time t6, the charging speed and the discharging speed are so slow that the output voltage $V_{out}$ forms a triangular shape. As a result, no one-shot pulse signal P is generated before the falling timing of the reference clock signal CLK. Thus, the count value N of the up counter 10U is fixed at 6.

According to the first embodiment as illustrated in FIG. 3, the capacitor 20 is incorporated into the triangular-wave generating apparatus 100A. Also, the reference clock signal generating circuit 8 is provided to determine the frequency of the output voltage $V_{out}$. Further, the AND circuit 9A, the up counter 10U, the subtracter 11 and the digital-to-analog converters 12 and 13 are provided to determine the charging current $I_c$ and the discharging current $I_d$, i.e., the charging and discharging speed of the capacitor 20. As a result, the charging current $I_c$ and the discharging current $I_d$ are automatically adjusted so that the charging and discharging timings are synchronized with the reference clock signal CLK. Thus, since no consideration needs to be given to the fluctuation of the charging current $I_c$ and the discharging current $I_d$ and the fluctuation of the external capacitor 200 as in the triangular-wave generating apparatus 100 of FIG. 1, a high accuracy of the triangular-wave output voltage $V_{out}$ can be obtained.

Also, since the capacitor 20 is incorporated into the triangular-wave generating apparatus 100A, the external capacitor 200 of FIG. 1 is unnecessary. In this case, since the capacitor 20 can be small, the power consumption would be decreased. Further, since the frequency of the output voltage $V_{out}$ is determined by the frequency of the reference clock signal CLK, no replacement of the capacitor 20 is required.

Figure 5:
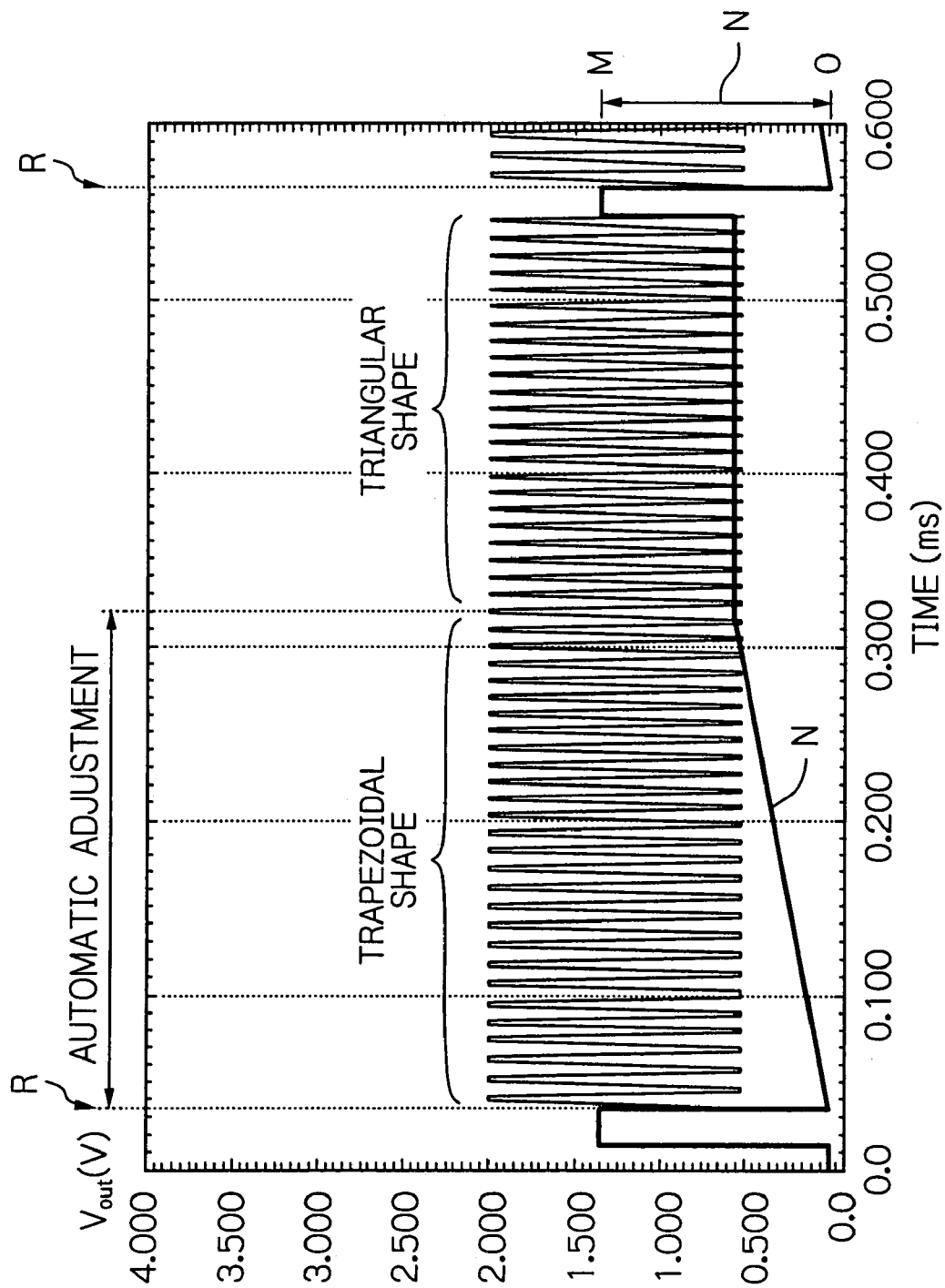
FIG. 5 is a timing diagram showing a simulation result of the operation of the triangular-wave generating apparatus of FIG. 3.

The simulation result of the operation of the triangular-wave generating apparatus 100A of FIG. 3 executed by the inventor is illustrated in FIG. 5. In FIG. 5, every time a reset signal R is supplied to the up counter 10U, the count value N of the up counter 10U is automatically increased to adjust the charging current $I_c$ and the discharging current $I_d$, so that accurate triangular-waves can be generated in synchronization with the reference clock signal CLK. In this case, when the range between 0 and M of the count value N is increased, the frequency of the triangular-wave output voltage $V_{out}$ can be increased. Also, when the number of bits of the up counter 10U is increased, i.e., when the resolution of the charging current $I_c$ and the discharging current $I_d$ is increased, the accuracy of the frequency of the output voltage $V_{out}$ can be improved.

In FIG. 5, note that the maximum value M corresponding to "11 . . . 1" is usually set in the up counter 10U immediately before the up counter 10U is reset. This setting operation is carried out in view of the circuit design; however, this setting operation is not indispensable.

Figure 6:
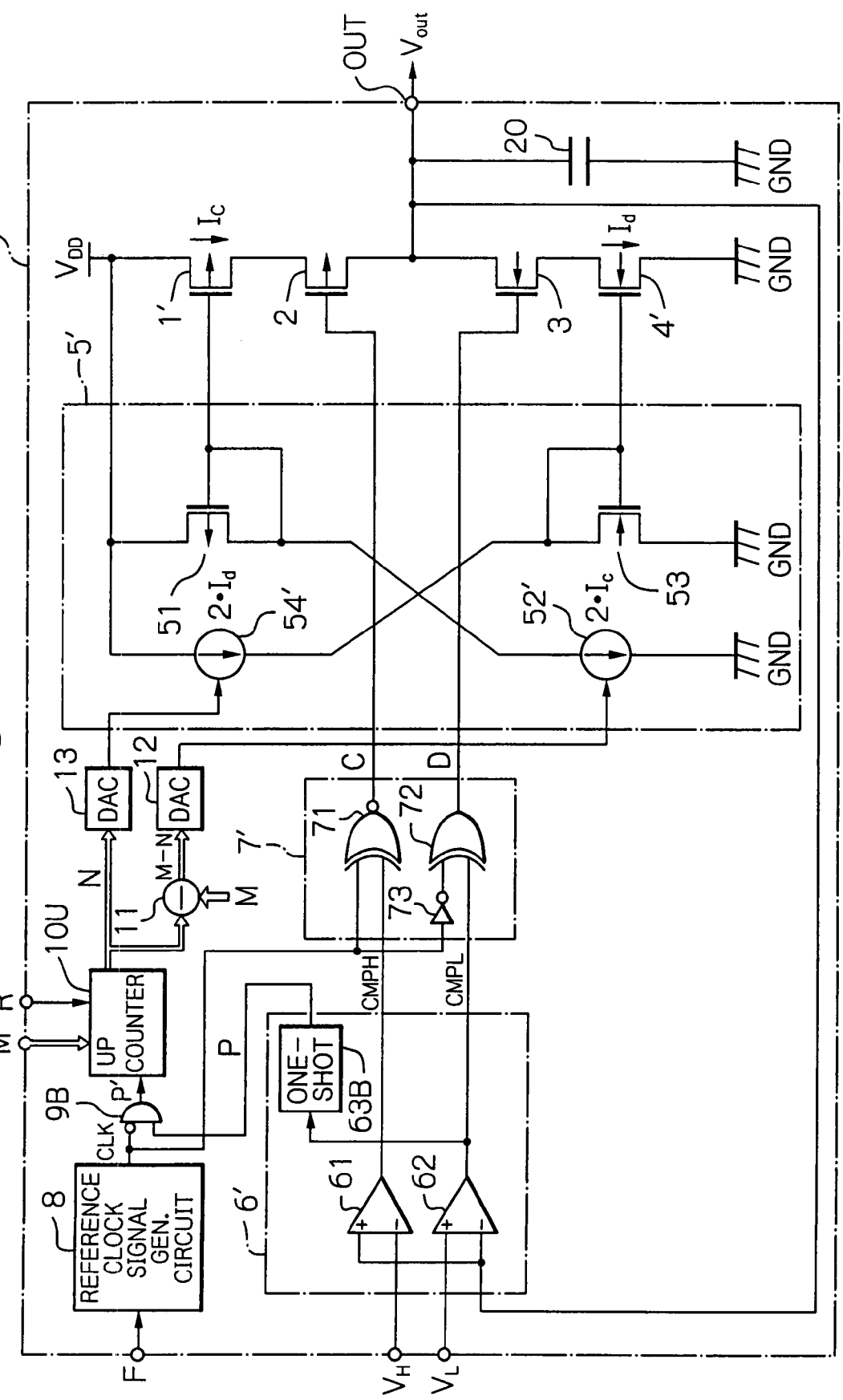
FIG. 6 is a circuit diagram illustrating a modification of the triangular-wave generating apparatus of FIG. 3.

In FIG. 6, which illustrates a modification of the triangular-wave generating apparatus 100A of FIG. 3, this modification is generally denoted by 100B. In the triangular-wave generating apparatus 100B, a one-shot multivibrator 63B is provided instead of the one-shot multivibrator 63A of FIG. 3. That is, the one-shot multivibrator 63B generates a one-shot pulse signal P when the comparison signal CMPL of the comparator 62 is switched from low to high. Also, a gate circuit 9B is provided instead of the AND circuit 9A of FIG. 3, so that the gate circuit 9B passes the one-shot pulse signal P as a one-shot pulse signal P', only when the reference clock signal CLK is low (GND).

The operation of the triangular-wave generating apparatus 100B of FIG. 6 is similar to that of the triangular-wave generating apparatus 100A of FIG. 3. Therefore, the same effect as in the first embodiment can be exhibited.

Figure 7:
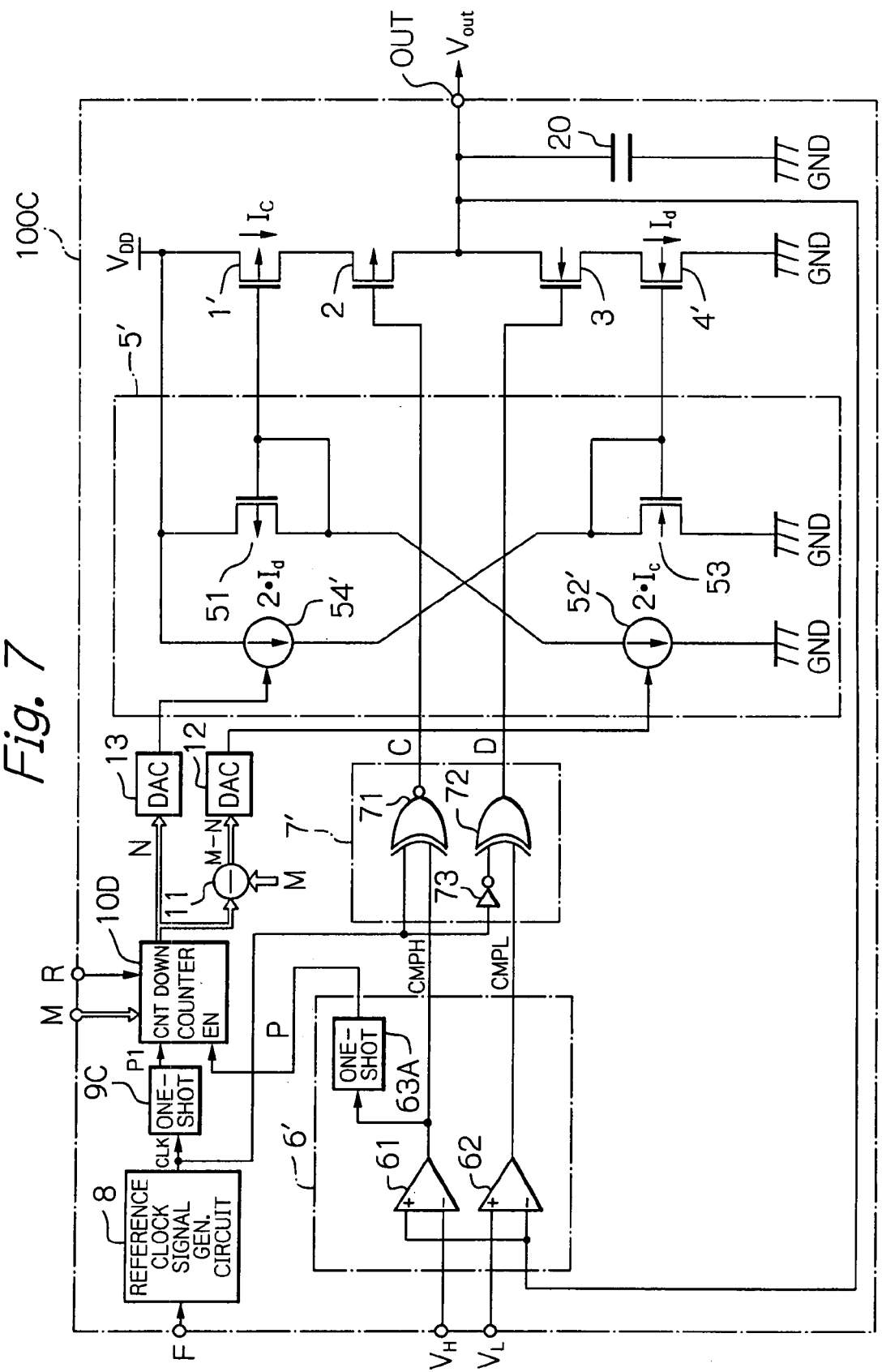
FIG. 7 is a circuit diagram illustrating a second embodiment of the triangular-wave generating apparatus according to the present invention.

In FIG. 7, which illustrates a second embodiment of the triangular-wave generating apparatus according to the present invention, the triangular-wave generating apparatus is generally denoted by reference numeral 100C.

In the triangular-wave generating apparatus 100C of FIG. 7, the AND circuit 9A and the up counter 10U of FIG. 3 are replaced by a one-shot multivibrator 9C and a down counter 10D. In this case, output of the one-shot multivibrator 9C is connected to the count input CNT of the down counter 10D, while the output of the one-shot multivibrator 63A is connected to the end input EN of the down counter 10D. The one-shot multivibrator 9C generates a one-shot-pulse signal P1 when the reference clock signal CLK of the reference clock signal generating circuit 8 is switched from high to low.

The one-shot circuit 9C, the down counter 10D, the subtracter 11 and the digital-to-analog converters 12 and 13 form a charging/discharging current adjusting circuit for adjusting the charging current $I_c$ and the discharging current $I_d$, which is explained below in detail.

The maximum count value M is initially set in the down counter 10D. Then, the down counter 10D counts the one-shot pulse signal P1. In this case, the count value N is decremented by an amount of 1 least signicant bit (LSB) every time a one-pulse signal P1 is received. Also, the count value N of the down counter 10D is stopped by receiving the one-shot pulse signal P from the one-shot multivibrator 63A. In this case, every increase amount of the count value N of the down counter 10D corresponds to a minimum charge amount of the analog output signals of the digital-to-analog converters 12 and 13, thus increasing the accuracy of the triangular wave.

The count value N is supplied via the subtracter 11 to the digital-to-analog converter 12. That is, the subtracter 11 subtracts the count value N from its maximum value M and transmits a value M–N to the digital-to-analog converter 12. Therefore, as the count value N decreases, the analog output value of the digital-to-analog converter 12 decreases so that the current $2 \cdot I_c$ flowing through the variable current source 52' is increased, i.e., the charging current $I_c$ is increased. On the other hand, the count value N is supplied directly to the digital-to-analog converter 13. Therefore, as the count value N decreases, the analog output value of the digital-to-analog converter 12 decreases so that the current $2 \cdot I_d$ flowing through the variable current source 54' is increased, i.e., the discharging current $I_d$ is increased.

When the reference clock signal CLK is switched from low to high, the charging signal C is switched from high to low, thus entering a charging mode.

On the other hand, when the reference clock signal CLK is switched from high to low, the charging signal C is switched from low to high, thus completing the charging mode. In this case, if the comparison signal CMPH rises before the falling of the reference clock signal CLK, the charging mode is completed at the rising timing of the comparison signal CMPH, and simultaneously, a one-shot pulse signal P is generated from the one-shot multivibrator 63A and is transmitted to the down counter 10D, to thereby stop the count value N of the down counter 10D.

When the reference clock signal CLK is switched from high to low, the discharging signal D is switched from low to high, thus entering a discharging mode.

On the other hand, when the reference clock signal CLK is switched from low to high, the discharging signal D is switched from high to low, thus completing the discharging mode. In this case, if the comparison signal CMPL rises before the rising of the reference clock signal CLK, the discharging mode is completed at the rising timing of the comparison signal CMPL.

The charging speed of the capacitor 20 depends upon the charging current $I_c$ flowing through the variable current source 1', and the discharging speed of the capacitor 20 depends upon the discharging current $I_d$ flowing through the variable current source 4'. Also, the charging current $I_c$ flowing through the variable current source 1' depends upon the current flowing through the variable current source 52', and the discharging current $I_d$ flowing through the variable current source 4' depends upon the current flowing through the variable current source 54'. Therefore, since the currents flowing through the variable current sources 52' and 54' gradually increase as the count value N of the down counter 10D decreases, the charging current $I_c$ and the discharging current $I_d$ gradually increase as the count value N of the down counter 10D decreases.

Figure 8:
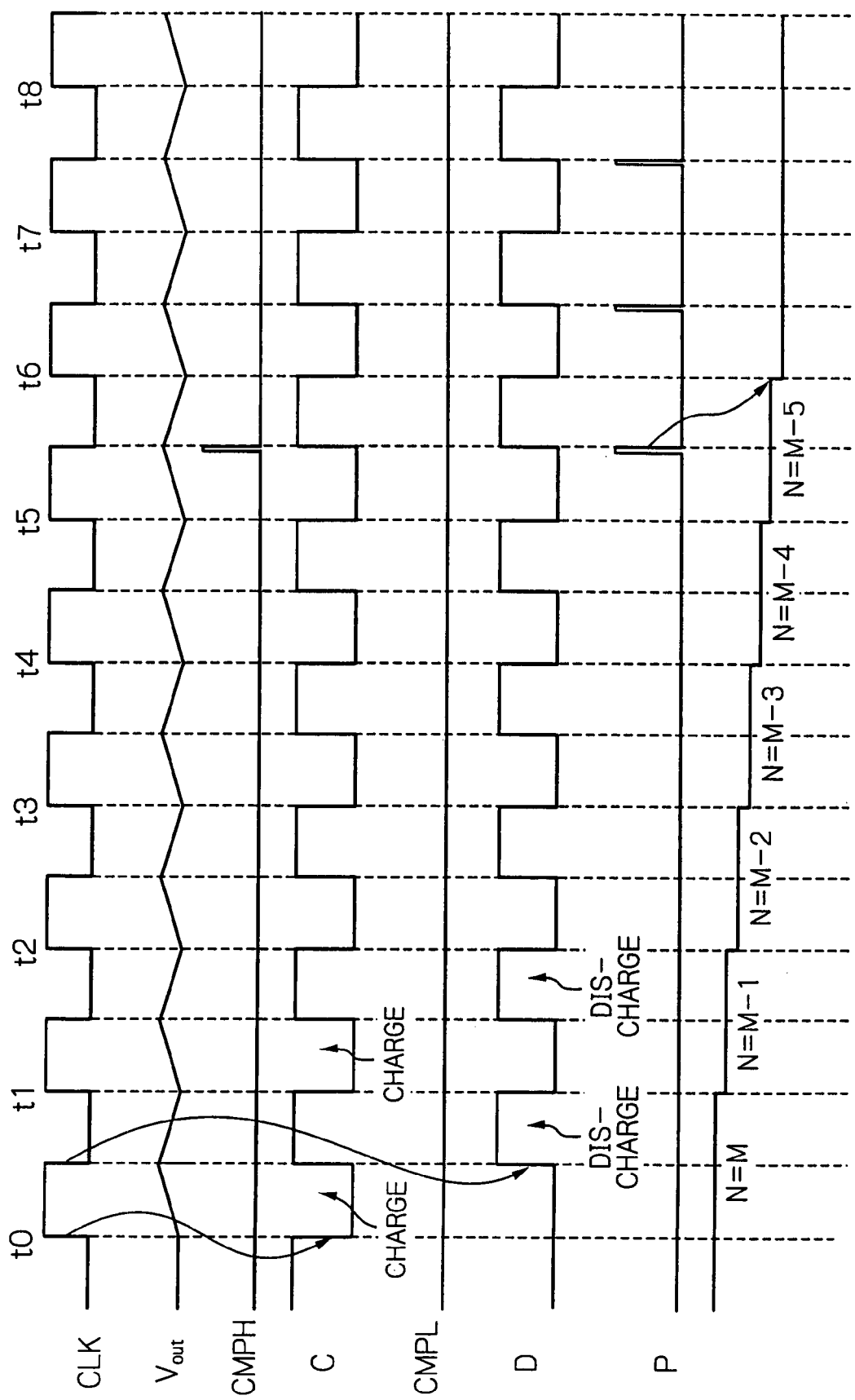
FIG. 8 is a timing diagram for explaining the operation of the triangular-wave generating apparatus of FIG. 7.

The operation of the triangular-wave generating apparatus 100C of FIG. 7 is explained next with reference to FIG. 8. In FIG. 8, the count value N of the down counter 10D is initialized so that N=M.

First, during a time period from time t0 to time t1, since N=M, the charging speed and the discharging speed are so slow that the output voltage $V_{out}$ forms a low triangular (incomplete triangular) shape. As a result, no one-shot pulse signal P is generated before the falling timing of the reference clock signal CLK, and a one-shot pulse signal P1 is transmitted to the count input CNT of the down counter 10D. Thus, the count value N of the down counter 10D is decremented by 1, so that N=M–1.

Next, during a time period from time t1 to time t2, since N=M–1, the charging speed and the discharging speed are slightly increased; however, the output voltage $V_{out}$ still forms a low triangular shape. Thus, the count value N of the down counter 10D is decremented by 1, so that N=M–2.

During a time period from time t2 to time t3, during a time period from time t3 to time t4, and during a time period from time t4 to time t5, although the charging speed and the discharging speed are gradually increased, the output voltage $V_{out}$ still forms a low triangular shape. Thus, the count value N of the down counter 10D reaches M–5.

Finally, after time t5, the charging speed and the discharging speed are so rapid that the output voltage $V_{out}$ forms a sufficiently high triangular shape. As a result, a one-shot pulse signal P is generated before the falling timing of the reference clock signal CLK. Thus, the count value N of the down counter 10D is fixed at M−5.

Even according to the second embodiment as illustrated in FIG. 7, of the capacitor 20 is incorporated into the triangular-wave generating apparatus 100C. Also, the reference clock signal generating circuit 8 is provided to determine the frequency of the output voltage $V_{out}$. Further, the gate circuit 9C, the down counter 10D, the subtracter 11 and the digital-to-analog converters 12 and 13 are provided to determine the charging current $I_c$ and the discharging current $I_d$, i.e., the charging and discharging speed of the capacitor 20. As a result, the charging current $I_c$ and the discharging current $I_d$ are automatically adjusted so that the charging and discharging timings are synchronized with the reference clock signal CLK. Thus, since no consideration needs to be given to the fluctuation of the charging current $I_c$ and the discharging current $I_d$ and the fluctuation of the external capacitor 200 as in the triangular-wave generating apparatus 100 of FIG. 1, a high accuracy of the triangular-wave output voltage $V_{out}$ can be obtained.

Also, since the capacitor 20 is incorporated into the triangular-wave generating apparatus 100C, the external capacitor 200 of FIG. 1 is unnecessary. In this case, since the capacitor 20 can be small, the power consumption would be decreased. Further, since the frequency of the output voltage $V_{out}$ is determined by the frequency of the reference clock signal CLK, no replacement of the capacitor 20 is required.

Even in the second embodiment, when the range between 0 and M of the count value N is increased, the frequency of the triangular-wave output voltage $V_{out}$ can be increased. Also, when the number of bits of the down counter 10D is increased, i.e., when the resolution of the charging current $I_c$ and the discharging current $I_d$ is increased, the accuracy of the frequency of the output voltage $V_{out}$ can be improved.

Figure 9:
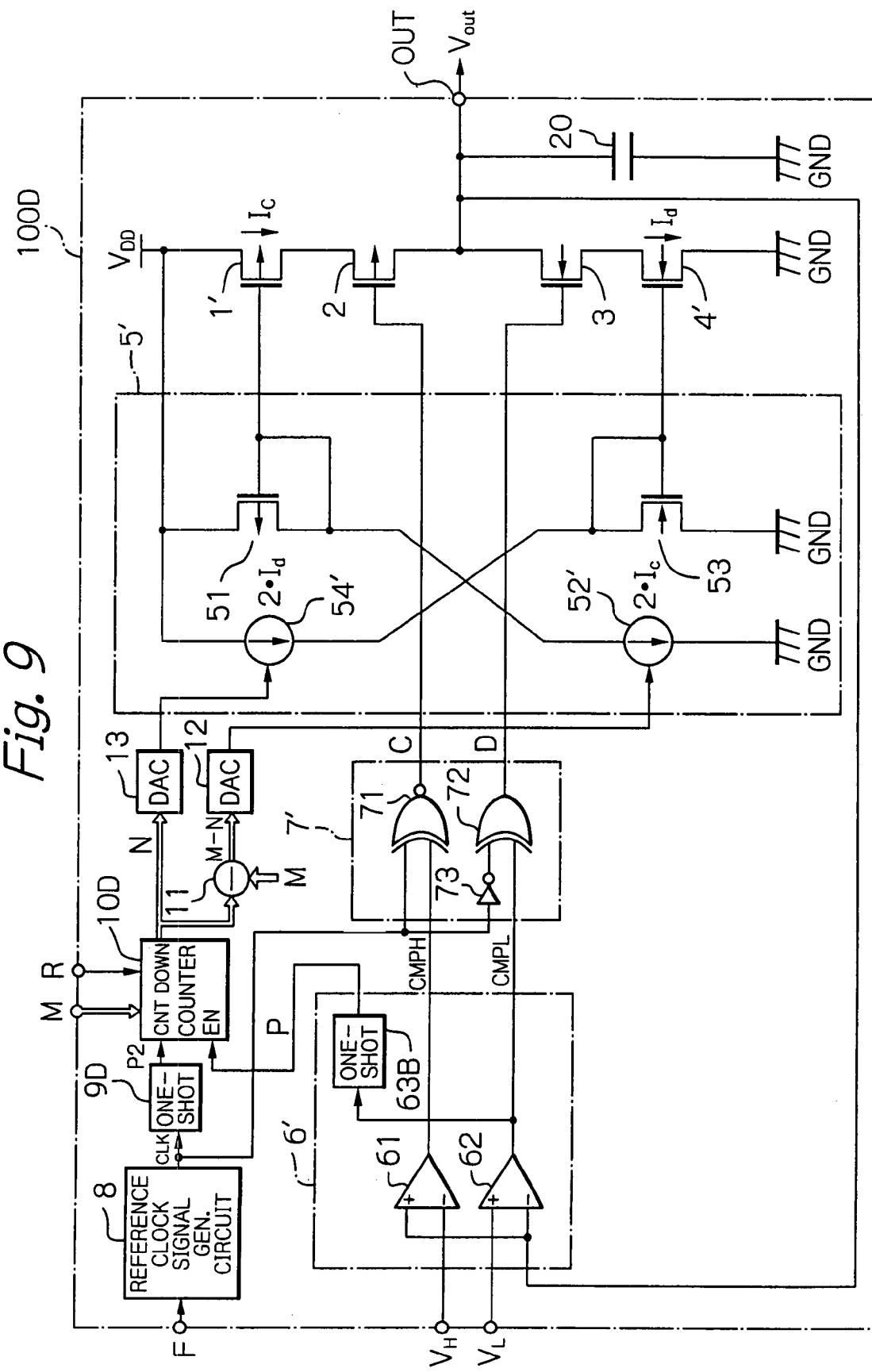
FIG. 9 is a circuit diagram illustrating a modification of the triangular-wave generating apparatus of FIG. 7.

In FIG. 9, which illustrates a modification of the triangular-wave generating apparatus 100C of FIG. 7, this modification is generally denoted by 100D. In the triangular-wave generating apparatus 100D, a one-shot multivibrator 63B is provided instead of the one-shot multivibrator 63A of FIG. 7. That is, the one-shot multivibrator 63B generates a one-shot pulse signal P when the comparison signal CMPL of the comparator 62 is switched from low to high. Also, a one-shot multivibrator 9D is provided instead of the one-shot multivibrator 9C of FIG. 7. The one-shot multivibrator 9D generates a one-shot pulse signal P2 when the reference clock signal CLK of the reference clock signal generating circuit 8 is switched from low to high.

The operation of the triangular-wave generating apparatus 100D of FIG. 9 is similar to that of the triangular-wave generating apparatus 100C of FIG. 7. Therefore, the same effect as in the first embodiment can be exhibited.

The invention claimed is:

1. A triangular-wave generating apparatus, comprising:
an output terminal adapted to output an output voltage;
an incorporated capacitor connected to said output terminal and directly to ground;
a first variable current source adapted to charge said incorporated capacitor;
a second variable current source adapted to discharge said incorporated capacitor;
a charging/discharging current setting circuit adapted to set a charging current in said first variable current source and set a discharging current in said second variable current source;
a level determining circuit adapted to determine whether or not said output voltage reaches one of predetermined voltages, to generate timing signals;
a reference clock signal generating circuit adapted to generate a reference clock signal for defining a frequency of said output voltage; and
a charging/discharging current adjusting circuit adapted to adjust said charging current and said discharging current in accordance with said timing signals and said reference clock signal.

2. The triangular-wave generating apparatus as set forth in claim 1, further comprising:
a charging switch connected between said first variable current source and said output terminal;
a discharging switch connected between said second variable current source and said output terminal; and
a driver connected to said level determining circuit, said reference clock signal generating circuit, said charging switch and said discharging switch, said driver being adapted to exclusively operate one of said charging switch and said discharging switch separately in accordance with said timing signals and said reference clock signal.

3. The triangular-wave generating apparatus as set forth in claim 1, wherein said level determining circuit generates said timing signals when said output voltage reaches predetermined voltages.

4. The triangular-wave generating apparatus as set forth in claim 1, wherein said predetermined voltages are a maximum voltage and a minimum voltage of a target triangular-wave of said output voltage.

5. The triangular-wave generating apparatus as set forth in claim 1, wherein said charging/discharging current setting circuit comprises:
a first transistor forming a current mirror circuit with said first variable current source;
a third variable current source connected commonly to said first variable current source and first transistor;
a second transistor forming a current mirror circuit with said second variable current source; and
a fourth variable current source connected commonly to said second variable current source and second transistor,
said third and second variable current sources being adjusted by said charging/discharging current adjusting circuit.

6. The triangular-wave generating apparatus as set forth in claim 5, wherein said level determining circuit includes a first one-shot multivibrator for generating a first one-shot pulse signal when said output voltage reaches one of said predetermined voltages.

7. The triangular-wave generating apparatus as set forth in claim 6, wherein said charging/discharging current adjusting circuit comprises:
an up counter adapted to count said first one-shot pulse signal when said reference clock signal is at a predetermined level;
a subtracter adapted to subtract a count value of said up counter from a maximum value thereof;
a first digital-to-analog converter adapted to perform a digital-to-analog conversion upon an output signal of said subtracter to generate a first analog signal for adjusting said third variable current source; and a second digital-to-analog converter adapted to perform a digital-to-analog conversion upon an output signal of said up counter to generate a second analog signal for adjusting said fourth variable current source.

8. The triangular-wave generating apparatus as set forth in claim 7, wherein every increase in an amount of a count value of said up counter corresponds to a minimum charge amount of said first and second digital-to-analog converters.

9. The triangular-wave generating apparatus as set forth in claim 5, wherein said charging/discharging current adjusting circuit comprises:
a second one-shot pulse multivibrator connected to said reference clock signal generating circuit, said second one-shot pulse multivibrator generating a second one-shot pulse signal when said reference clock signal is switched,
a down counter adapted to count said second one-shot pulse signal, said down counter being stopped when said first one-shot pulse signal is received;
a subtracter adapted to subtract a count value of said down counter from a maximum value thereof;
a first digital-to-analog converter adapted to perform a digital-to-analog conversion upon an output signal of said subtracter to generate a first analog signal for adjusting said third variable current source; and
a second digital-to-analog converter adapted to perform a digital-to-analog conversion upon an output signal of said up counter to generate a second analog signal for adjusting said fourth variable current source.

10. The triangular-wave generating apparatus as set forth in claim 9, wherein every decrease in an amount of a count value of said down counter corresponds to a minimum charge amount of said first and second digital-to-analog converters.

11. The triangular-wave generating apparatus as set forth in claim 1, wherein the incorporated capacitor is incorporated on to a chip containing the triangular-wave generating apparatus.

12. The triangular-wave generating apparatus of claim 11, wherein the level determining circuit comprises:
a first comparator configured to determine if the output voltage reaches the high level; and
a second comparator configured to determine if the output voltage reaches the low level.

13. The triangular-wave generating apparatus of claim 12, wherein the one-shot multivibrator is connected to the first comparator, and
wherein the one-shot multivibrator generates the one-shot pulse signal when the first comparator is switched from low to high.

14. The triangular-wave generating apparatus of claim 12, wherein the one-shot multivibrator is connected to the second comparator, and
wherein the one-shot multivibrator generates the one-shot pulse signal when the second comparator is switched from low to high.

15. A triangular-wave generating apparatus, comprising:
a reference clock generating circuit configured to determine a frequency of an output signal and to provide a reference clock signal;
a discharge variable current source configured to output a discharge current having a discharge time synchronized with the reference clock signal;
a charge variable current source configured to output a charge current having a charge time synchronized with the reference clock signal; and
a capacitor provided between the discharge variable current source and the charge variable current source and an output terminal, the capacitor also provided between ground and the output terminal.

16. The triangular-wave generating apparatus of claim 15, further comprising:
an up-counter;
a level determining circuit configured to determine whether the output signal is above a high level or below a low level; and
a one-shot multivibrator configured to generate a one-shot pulse signal when the level determining circuit determines that the output signal reaches one of the high level or the low level,
wherein an AND circuit passes the one-shot pulse signal through to the up-counter when the reference clock signal is high, and
wherein the up-counter increases a count by one every time the one-shot pulse signal is received.

17. The triangular-wave generating apparatus of claim 15, further comprising:
a down-counter; and
a one-shot multivibrator provided between the reference clock generating circuit and the down-counter, the one-shot multivibrator configured to generate a one-shot pulse signal when the reference clock signal is switched from high to low.

18. The triangular-wave generating apparatus of claim 15, further comprising:
a down-counter; and
a one-shot multivibrator provided between the reference clock generating circuit and the down-counter, the one-shot multivibrator configured to generate a one-shot pulse signal when the reference clock signal is switched from low to high.

19. The triangular-wave generating apparatus of claim 15, wherein a frequency of the reference clock signal is changed by receiving a signal, so that a frequency of the output signal is the same as that of the reference clock signal, said reference clock signal being a rectangular wave signal having a high level voltage for a half period and a low level voltage for another half period.

20. A triangular-wave generating apparatus, comprising:
an output terminal adapted to output an output voltage;
an incorporated capacitor connected to said output terminal;
a first variable current source adapted to charge said incorporated capacitor;
a second variable current source adapted to discharge said incorporated capacitor;
a charging/discharging current setting circuit adapted to set a charging current in said first variable current source and set a discharging current in said second variable current source, said charging/discharging current setting circuit comprising:
an up counter adapted to count a first one-shot pulse signal when said reference clock signal is at a predetermined level;
a subtracter adapted to subtract a count value of said up counter from a maximum value thereof;
a first digital-to-analog converter adapted to perform a digital-to-analog conversion upon an output signal of said subtracter to generate a first analog signal for adjusting said third variable current source; and
a second digital-to-analog converter adapted to perform a digital-to-analog conversion upon an output signal of said up counter to generate a second analog signal for adjusting said fourth variable current source;

a level determining circuit adapted to determine whether or not said output voltage reaches one of predetermined voltages, to generate timing signals;

a reference clock signal generating circuit adapted to generate a reference clock signal for defining a frequency of said output voltage; and a charging/discharging current adjusting circuit adapted to adjust said charging current and said discharging current in accordance with said timing signals and said reference clock signal.

* * * * *